United States Patent
Bilhan et al.

(10) Patent No.: US 11,626,875 B2
(45) Date of Patent: Apr. 11, 2023

(54) STRESS REDUCTION ON STACKED TRANSISTOR CIRCUITS

(71) Applicant: TEXAS INSTRUMENTS INCORPORATED, Dallas, TX (US)

(72) Inventors: Erkan Bilhan, Dallas, TX (US); Francisco A. Cano, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/262,327

(22) Filed: Jan. 30, 2019

(65) Prior Publication Data

US 2019/0326909 A1  Oct. 24, 2019

Related U.S. Application Data

(60) Provisional application No. 62/795,461, filed on Jan. 22, 2019, provisional application No. 62/786,507, filed on Dec. 30, 2018, provisional application No. 62/660,593, filed on Apr. 20, 2018.

(51) Int. Cl.
*H03K 19/003* (2006.01)
*H03K 19/20* (2006.01)

(52) U.S. Cl.
CPC ....... *H03K 19/00315* (2013.01); *H03K 19/20* (2013.01)

(58) Field of Classification Search
None
See application file for complete search history.

(56) References Cited

U.S. PATENT DOCUMENTS

| | | | | |
|---|---|---|---|---|
| 5,317,206 A | * | 5/1994 | Hanibuchi | H03K 19/00361 326/21 |
| 5,426,383 A | * | 6/1995 | Kumar | H03K 19/09441 326/119 |
| 5,629,638 A | * | 5/1997 | Kumar | G06F 30/327 326/121 |
| 5,726,589 A | * | 3/1998 | Cahill | H03K 19/00315 326/81 |
| 6,016,064 A | * | 1/2000 | Saeki | H03K 5/133 326/121 |
| 6,225,820 B1 | * | 5/2001 | Kim | H03K 19/0027 326/121 |
| 6,239,958 B1 | * | 5/2001 | Kato | G11C 7/24 361/56 |
| 6,331,787 B1 | * | 12/2001 | Whitworth | H04L 25/0278 326/30 |

(Continued)

*Primary Examiner* — Jason Crawford
(74) *Attorney, Agent, or Firm* — Carl G. Peterson; Frank D. Cimino

(57) ABSTRACT

A circuit includes a first transistor having first and second current terminals and a first control input, and a second transistor having third and fourth current terminals and a second control input. The third current terminal is connected to the second current terminal at an intermediate node and the fourth current terminal connected to a ground or supply node. In some cases, a third transistor is connected to the intermediate node to bias the intermediate rather than letting the intermediate node float. In other cases, a capacitor is connected to the intermediate node to reduce a negative voltage that might otherwise be present on the intermediate node.

6 Claims, 5 Drawing Sheets

(56) References Cited

U.S. PATENT DOCUMENTS

| | | | | |
|---|---|---|---|---|
| 6,600,354 | B2* | 7/2003 | Saeki | G06F 1/10 |
| | | | | 327/294 |
| 6,975,143 | B2* | 12/2005 | Deng | H03K 19/0948 |
| | | | | 326/119 |
| 7,202,863 | B2* | 4/2007 | Kimura | G09G 3/36 |
| | | | | 345/204 |
| 7,239,190 | B2* | 7/2007 | Saeki | G06F 1/10 |
| | | | | 327/299 |
| 8,111,089 | B2* | 2/2012 | Cocchi | H03K 19/20 |
| | | | | 326/113 |
| 2013/0214854 | A1* | 8/2013 | Abe | H01L 29/7869 |
| | | | | 257/43 |
| 2014/0232432 | A1* | 8/2014 | Fish | G06F 9/3869 |
| | | | | 326/104 |
| 2016/0232956 | A1* | 8/2016 | Ishizu | G11C 8/12 |
| 2016/0233866 | A1* | 8/2016 | Ishizu | H03K 19/0008 |
| 2019/0326909 | A1* | 10/2019 | Bilhan | H03K 19/00315 |
| 2019/0326910 | A1* | 10/2019 | Bilhan | H03K 19/20 |

* cited by examiner

US 11,626,875 B2

STRESS REDUCTION ON STACKED TRANSISTOR CIRCUITS

CROSS-REFERENCE TO RELATED APPLICATIONS

The present application claims priority to U.S. Provisional Patent Application Ser. No. 62/660,593, filed Apr. 20, 2018; U.S. Provisional Patent Application Ser. No. 62/786,507, filed Dec. 30, 2018; and, U.S. Provisional Patent Application Ser. No. 62/795,461, filed Jan. 22, 2019, which are hereby incorporated herein by reference in their entirety.

BACKGROUND

Many types of circuits include two or more transistors connected in a stacked configuration. In the case of, for example, metal oxide semiconductor (MOS) transistors, the source of one transistor is connected to the drain of the next transistor in the stack. NAND gates, NOR gates, flip-flops often include stacked transistors.

SUMMARY

A circuit includes a first transistor having first and second current terminals and a first control input, and a second transistor having third and fourth current terminals and a third control input. The third current terminal is connected to the second current terminal at an intermediate node and the fourth current terminal connected to a ground node. In some cases, a third transistor is connected to the intermediate node to bias the intermediate rather than letting the intermediate node float. In other cases, a capacitor is connected to the intermediate node to reduce a negative voltage that might otherwise be present on the intermediate node.

BRIEF DESCRIPTION OF THE DRAWINGS

For a detailed description of various examples, reference will now be made to the accompanying drawings in which.

DETAILED DESCRIPTION

In a stacked transistor configuration, the node interconnecting two transistors may float during operation of the circuit containing the stacked transistors. Further, due to parasitic capacitance between a gate and a drain of one of the transistors of the stack, the voltage on the floating node interconnecting the transistors may fall below ground (negative voltage) thereby potentially causing a drain-to-source voltage (VDS) of one of the transistors in the stack to exceed the supply voltage while the gate-to-source voltage (VGS) of the same transistor is greater than zero but below the transistor's threshold voltage (VT). Subjecting a transistor to an elevated VDS (e.g., in excess of the circuit's VDD supply voltage) while also operating the transistor in the sub-threshold region can cause non-conductive stress on the transistor possibly leading to degradation in the performance of the transistor over time and even the transistor's failure.

The described examples address this problem. The examples herein pertain to a transistor stack (two or more serially-connected transistors). Many types of circuits use transistor stacks. Examples of such circuits include NAND gates, NOR gates, and flip-flops. The described examples are directed to NAND gates for illustrative purposes, but the scope of this disclosure is not limited to NAND gates.

Figure 1:
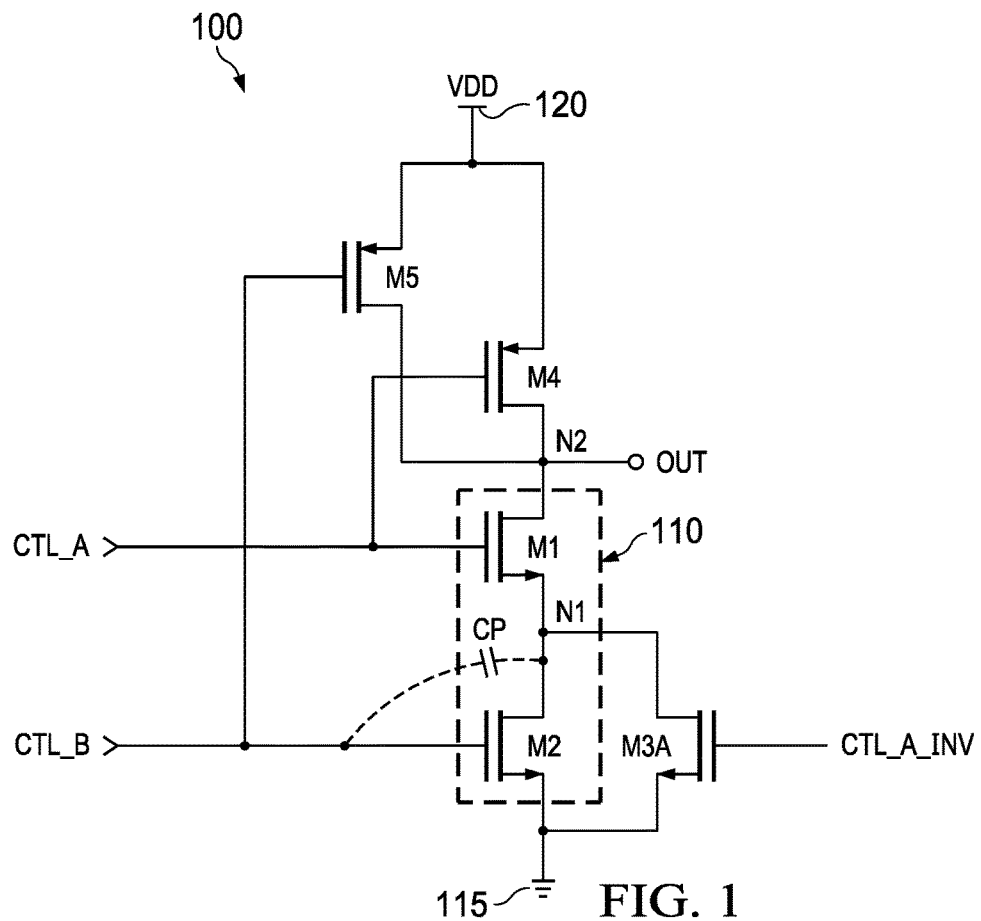
FIG. 1 illustrates an example of a circuit including a transistor stack and a component to provide a direct current (DC) bias to an intermediate node of the transistor stack.

FIG. 1 shows an embodiment of a NAND gate 100 including transistors M1, M2, M3A, M4, and M5. Each transistor M1, M2, M3A, M4, and M5 includes a control input and a pair of current terminals. In the example of FIG. 1, transistors M1 M2 and M3A are n-channel metal oxide semiconductor field effect transistors (NMOS devices) and transistors M4 and M5 are p-channel metal oxide semiconductor field effect transistors (PMOS devices). As such, the control inputs are the gates of the respective transistors and the current terminals are the drains and sources of the respective transistors. In other implementations, any of the transistors shown in FIG. 1 can be of the opposite doping type from that shown. For example, M1 can be implemented as PMOS device. Further, any or all of the transistors shown in FIG. 1 can be implemented as bipolar junction transistors or other transistor types. As bipolar junction transistors, the control inputs are the bases of the transistors and the current terminals are the emitters and collectors.

M1 and M2 form a transistor stack 110. The source of M1 is connected to the drain of M2 thereby defining an intermediate node N1. The source of M2 is connected to a ground node 115. The drain of M1 is connected to the drains of M4 and M5 at node N2 and the sources of M4 and M5 are connected to a supply voltage node 120 (VDD).

The gates of M1 and M4 are connected together and receive a control signal CTL_A. The gates of M2 and M5 are connected together and receive a control signal CTL_B. The output (OUT) from circuit 100 is the node N2 interconnecting the drains of M1, M4, and M5 as shown. As a NAND gate, the inputs are the control signals CTL_A and CTLB and the output is OUT. When both CTL_A and CTL_B are logic high ("1"), both NMOS devices M1 and M2 are on and both the PMOS device M4 and M5 are off. With both M1 and M2 being on, OUT is pulled low to ground and thus is logic low ("0"). When either or both of CTL_A or CTL_B are low, their respective NMOS device M1 or M2 is turned off thereby disconnecting OUT from the ground potential of the ground node 115. Further, when either or both of CTL_A or CTL_B are low, their respective PMOS device M4 or M5 is turned on thereby pulling OUT up to the VDD potential of the power supply node 120. As such, OUT is only low when both CTL_A and CTL_B are low; otherwise OUT is high.

Figure 2:
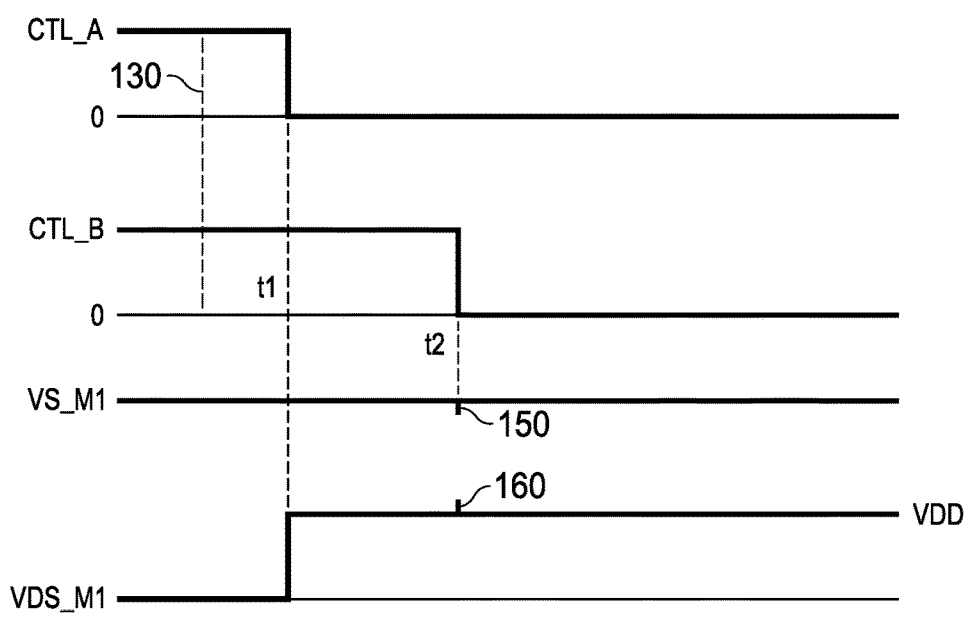
FIG. 2 illustrates waveforms pertaining to the circuit of FIG. 1.

An example of timing diagrams for the operation of NAND gate 100 are shown in FIG. 2 for CTL_A, CTL_B, the source voltage of M1 (VS_M1), and the VDS of M1 (VDS_M1). At 130, both CTL_A and CTL_B are high, which causes both of M1 and M2 to be on. At time t1, CTL_A transitions from high to low, while CTL_B remains high. VS_M1 is low due to M2 to being on and connected to ground. Further, VDS_M1 is low because M1 is on.

At time t2, CTL_B transitions from high to low. Ignoring M3A for the time being, upon CTL_B transitioning from high to low, M2 turns off. As M2 turns off (and assuming M3A is not present in the circuit), intermediate node N1 floats. With N1 floating, parasitic capacitance between the gate and drain of M2 (as shown by parasitic capacitance CP in FIG. 1) causes the voltage on N1 to fall below the ground potential and, if that were to happen, the voltage on the source of M1 decreases below ground and VDS_M1 increases to a voltage above VDD. In this state, M1 is operating in the subthreshold region as its VGS is greater than 0 but less than its VT while its VDS is above VDD thereby causing impairment of the long-term reliability of the circuit.

The inclusion of M3A, however, solves this problem. The drain of M3A is connected to the intermediate node N1 and the source of M3A is connected to the ground node 115. When M3A is on, intermediate node N1 is biased to ground. The gate of M3A is controlled by a control signal labeled as CTL_A INV. CTL_A INV is of the opposite polarity as CTL_A. In one example, an inverter can be included to invert CTL_A to produce CTL_A INV. When M1 is off due to CTL_A being low, M3A is on due to CTL_A INV being high. M3A being on thereby imposes a direct current (DC) bias voltage on N1 (ground in this example). By DC biasing the intermediate node N1 at the ground potential, the reduction in voltage on N1 (VS_M1) due to M2 turning off and the parasitic gate-to-drain capacitance of M2 is significantly less than would be the case absent M3A.

As FIG. 2 show, VS_M1 is at 0V while CTL_B is high (which forces M2 to be on). When CTL_A transitions from high to low at t1, CTLA_INV transitions from low to high thereby turning on M3A and DC biasing N1 to ground starting at t1. Node N1 remains biased to ground even after CTL_B transitions low at t2 turning M2 off due to the continued operation of M3A in the on state. A small downward momentary drop in VS_M1 may be present as indicated at 150. A small and short duration increase in VDS_M1 is also present as shown at 160 due to decrease in VS_M1 at 150, but the upward blip of VSS_M1 is much smaller in both magnitude and duration than would have been the case had M3A not been present.

The example of FIG. 1 shows a transistor stack comprising two transistors M1 and M2. The described principles for FIG. 1 and the other figures/examples apply as well to transistor stacks comprising more than two transistors.

Figure 3:
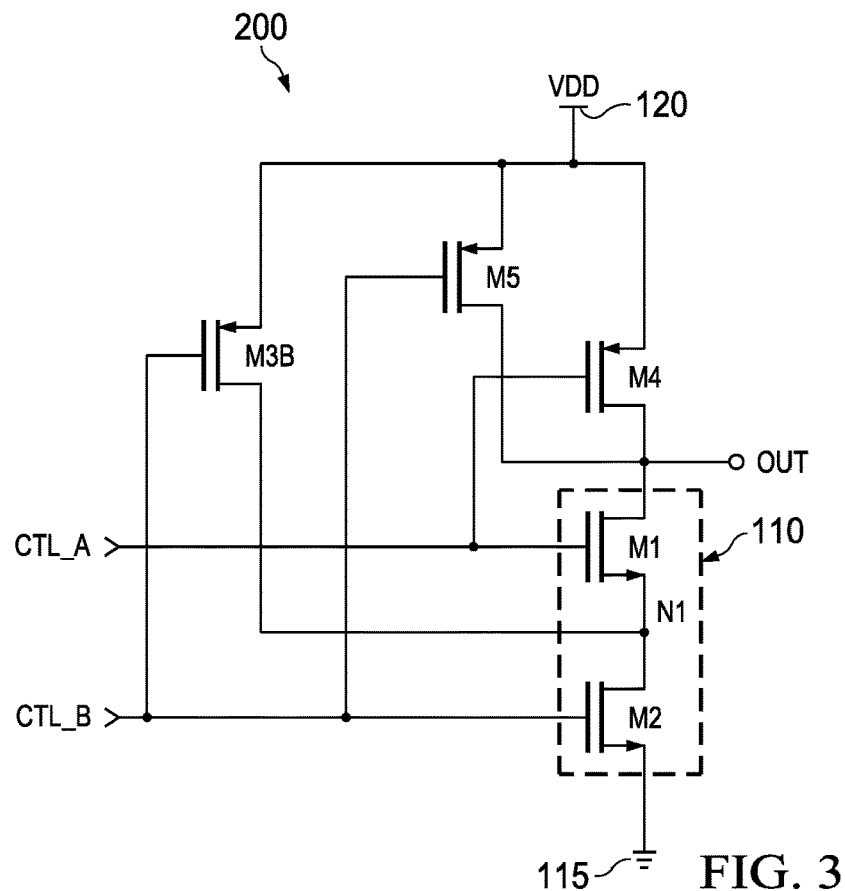
FIG. 3 shows another example of a circuit including a transistor stack and a component to DC bias to an intermediate node of the transistor stack.

FIG. 3 shows an example of a NAND gate 200 including some of the same components (e.g., M1, M2, M4, and M5) as in the example of FIG. 1. The NAND gate 200 of FIG. 3 includes a transistor M3B to impose a DC bias on intermediate node N1. In this example, M3B is a PMOS transistor whose source is connected to the supply voltage node 120 and whose drain is connected to intermediate node N1. The gate of M3B is connected to the gate of M2 and thus is controlled by the same control signal (CTL_B) as M2. An inverter is not needed to generate the control signal for M3B. As M2 is an NMOS transistor and M3B is a PMOS transistor, M2 will be on and M3B off when CTL_B is high, and M2 will be off and M3B on when CTL_B is low. Because M3B is connected to VDD, when M2 is caused to transition from on to off, M3B is turned on thereby providing a DC bias on node N1 approximately equal to VDD. This DC bias prevents the voltage on node N1 (VS_M1) from becoming negative.

Figure 4:
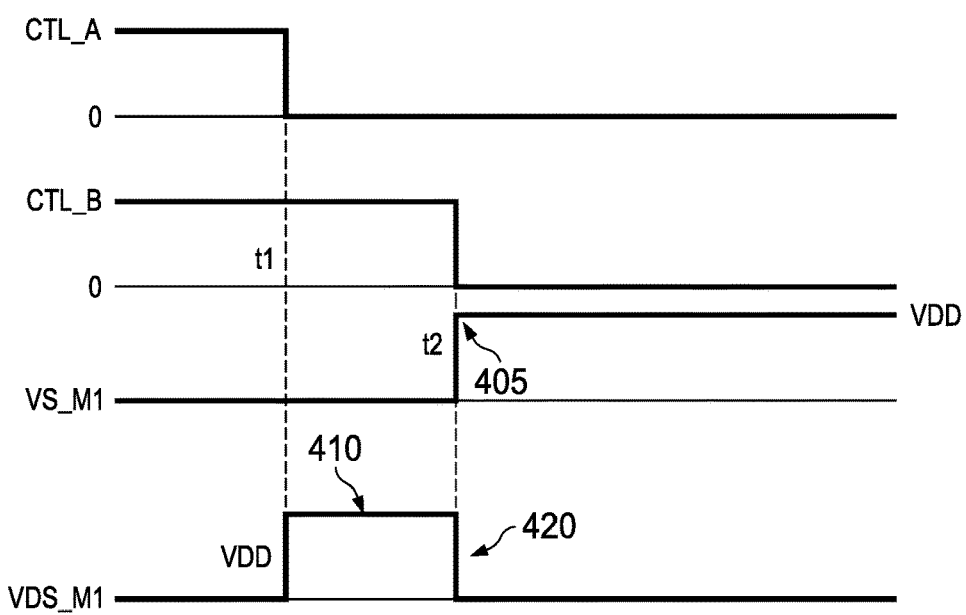
FIG. 4 illustrates waveforms pertaining to the circuit of FIG. 3.

FIG. 4 shows an example of waveforms pertaining to FIG. 3. As in FIG. 2, CTL_A is forced low at time t1 and CTL_B is forced low at time t2. Prior to t1, with both M1 and M2 on, VS_M1 is pulled low to ground. Between t1 and t2, VS_M1 remains low because M2 is still on. When M2 is turned off at t2, M3B is turned on thereby forcing MS_M1 to become high as shown at t2 (405). VDS_M1 is low prior to t1 because M1 is on prior to t1. Once M1 turns off at t1, M4 turns on thereby causing the drain of M1 to become high. With M2 still on between t1 and t2, the source of M1 (voltage on node N1) is low and thus VDS_M1 is high between t1 and t2 as shown at 410. Once M2 also turns off at t2, the source of M1 becomes high due to M3B being on. M4 continues to be on due to CTL_A being low and the voltage on the drain of M1 remains high. Thus, VDS_M1 drops to zero again at edge 420. The VDS_M1 voltage does not increase above VDD thereby avoiding or at least reducing the problem noted above.

Figure 5:
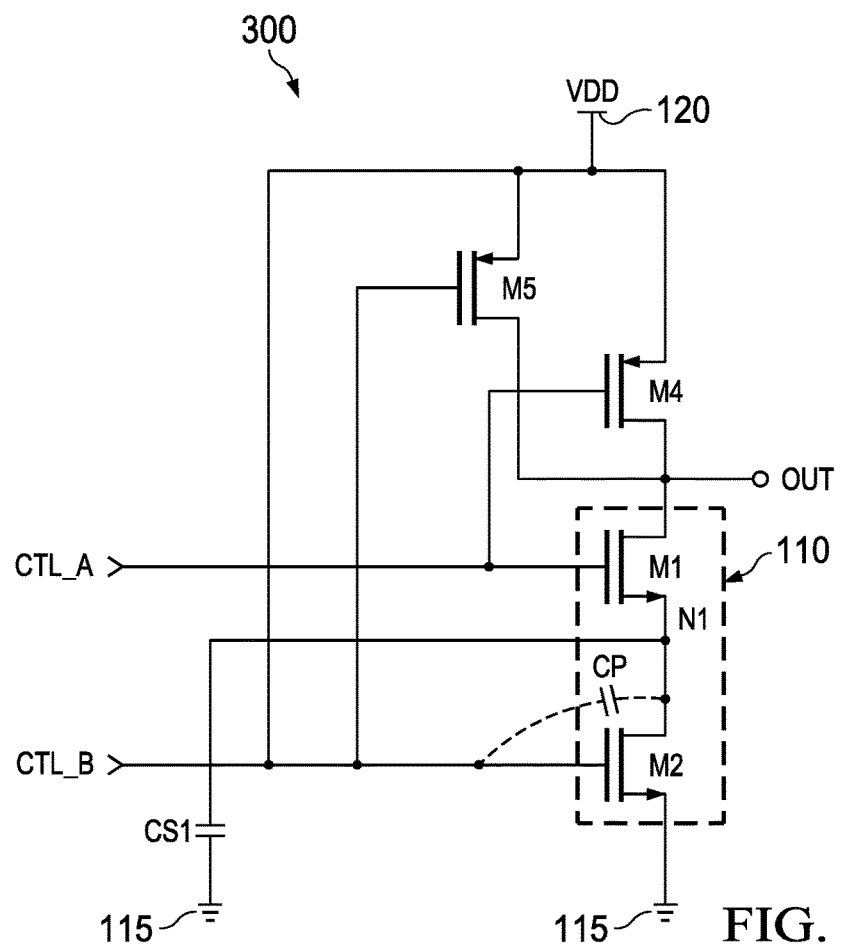
FIG. 5 shows another example of a circuit including a transistor stack and a capacitor connected to an intermediate node of the transistor stack.
Figure 6:
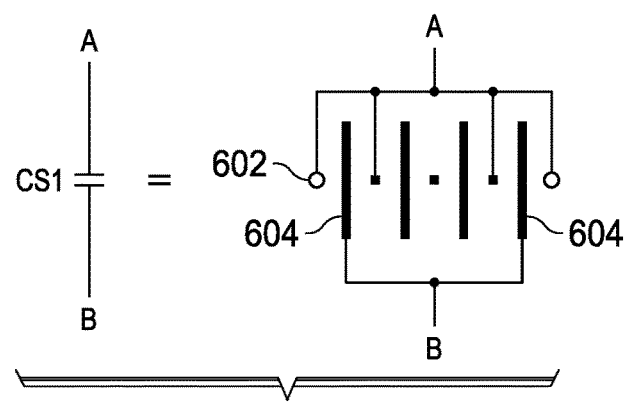
FIG. 6 shows an example implementation of the capacitor.

FIG. 5 shows an example of a NAND gate 300 including some of the same components (e.g., M1, M2, M4, and M5) as in the example of FIG. 1. The NAND gate 300 of FIG. 5 includes a capacitor CS1 connected between intermediate node N1 and ground. CS1 can be implemented as a device capacitor, a MOS transistor whose drain and source are connected together so that the gate is one terminal of the capacitor 604 and the drain/source connection is the other terminal of the capacitor 602, or any other type of capacitive device. In one example, extra "dummy" transistors may be available on a semiconductor die that can be configured to be capacitor CS1. FIG. 6 shows an example of an implementation of the capacitor (CS1) by utilizing the dummy structures around actual transistor (M2). Gates 604 of the dummy structures connect to ground 115 (FIG. 5.) and the drain and source 602 connect to node N1 (FIG. 5) shared with M2.

Figure 7:
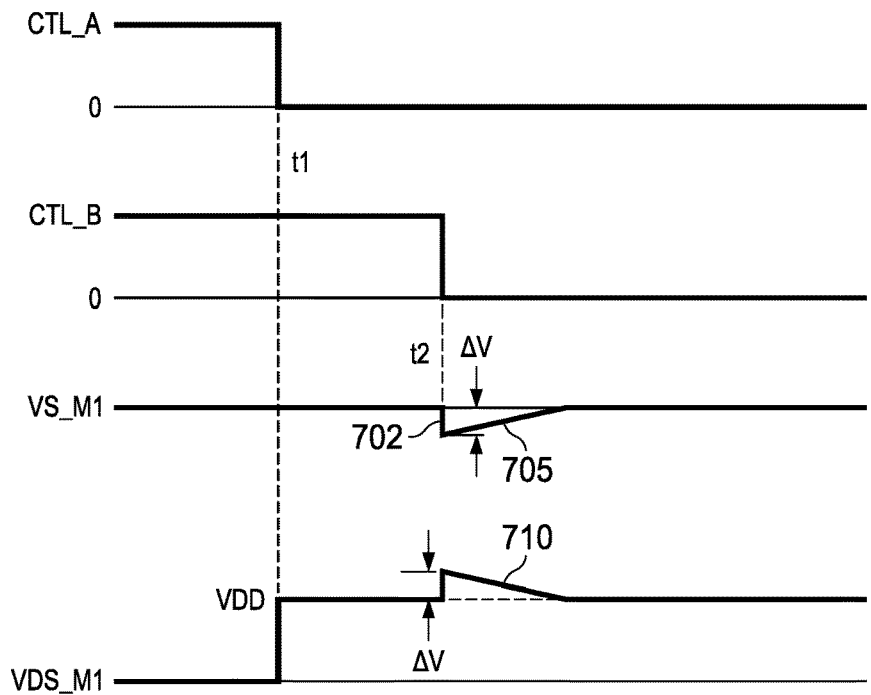
FIG. 7 illustrates waveforms pertaining to the circuit of FIG. 5.

Capacitor CS1 limits the charge coupling from the gate of M2 to the intermediate node N1. The size of capacitor CS1 is application-specific. FIG. 7 shows an example of waveforms pertaining to FIG. 5. As in FIG. 2, CTL_A is forced low at time t1 and CTL_B is forced low at time t2. Prior to t1, with both M1 and M2 on, VS_M1 is pulled low to ground. Between t1 and t2, VS_M1 remains low because M2 is still on. When M2 is turned off at t2, the voltage on node N1 (VS_M1) drops slightly ($\Delta V$) due to the parasitic capacitance CP as shown at 702. However, the drop in VS_M1 voltage is not as large as would be the case without CS1. Negative charge on N1 dissipates through device leakage and VS_M1 then begins to increase as shown at 705. VDS_M1 is zero volts while M1 is on; once M1 turns off and M4 turns on, VDS_M1 increases to VDD as shown at time t1. VDS_M1 remains at VDD until t2 at which time M2 turns off and VS_M1 drops below zero at 702 and charges back up to zero volts at 705 as negative charge dissipates through device leakage. The drain of M1 remains fixed at VDD, but the source of M1 drops and then rises. The drop and then rise of VS_M1 is thus reflected in VDS_M1 as shown at 710. The increase in VDS_M1 above VDD also is $\Delta V$ and is less than would be the case absent CS1.

Figure 8:
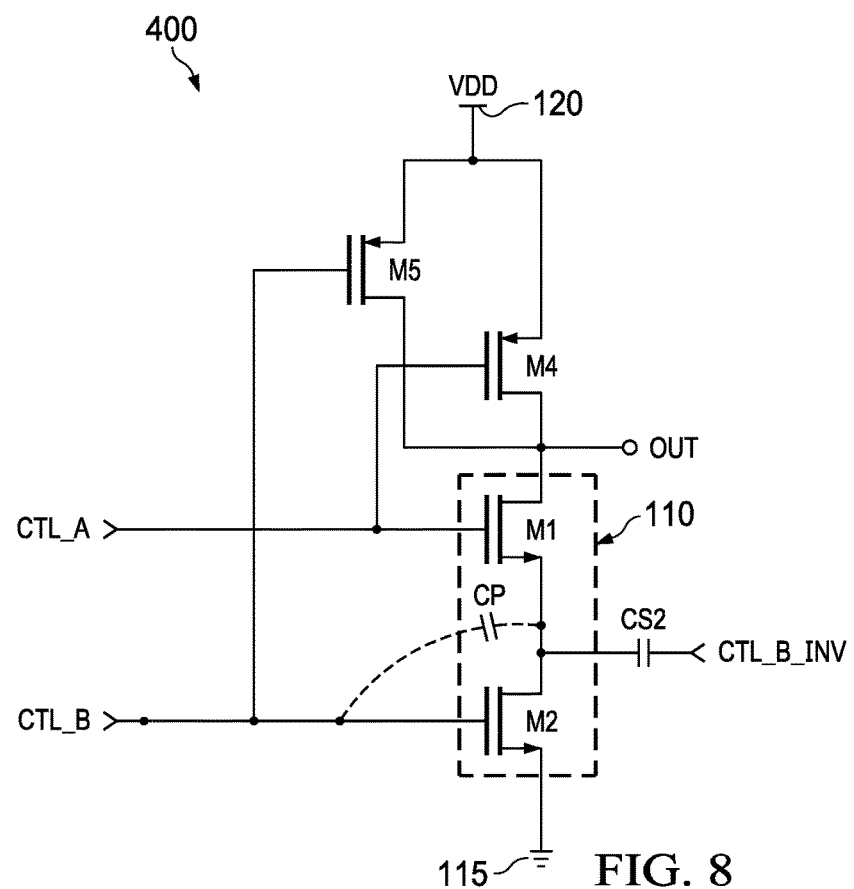
FIG. 8 shows another example of a circuit including a transistor stack and a capacitor connected to an intermediate node of the transistor stack.

FIG. 8 shows an example of a NAND gate 400 including some of the same components (e.g., M1, M2, M4, and M5) as in the example of FIG. 1. The NAND gate 400 of FIG. 8 includes a capacitor CS2 with one terminal being connected to intermediate node N1 and the other terminal receiving a control voltage CTL_B_INV (opposite polarity of CTL_B, generated, for example, by an inverter). CS2 can be implemented as described above regarding CS1. Through capacitor CS2, opposite charge is provided to node N1 from that caused by the parasitic capacitor CP. That is, to a certain degree, capacitor CS2 provides charge balancing on node N1 thereby reducing the large downward drop in voltage on N1 that would otherwise be the case in the absence of CS2. The coupling efficiency is given by Cp/Ctotal, where Ctotal is the total capacitance of the intermediate node N1. In the case of CS1 connected to ground, the coupling efficiency is decreased per Cp/(Cotal+CS1). In the case of CS2 since the opposite terminal of CS2 is also switching between VDD and GND the coupling efficiency is reduced per Cp(Cotal+ 2*CS2). Thus, the ratio of voltages from without either CS1 or CS2 as compared to inclusion of CS1 or CS2 is, in the case of CS1 Ctotal/(Ctotal+CS1) and in the case of CS2 Ctotal/(Ctotal+2*CS2).

Figure 9:
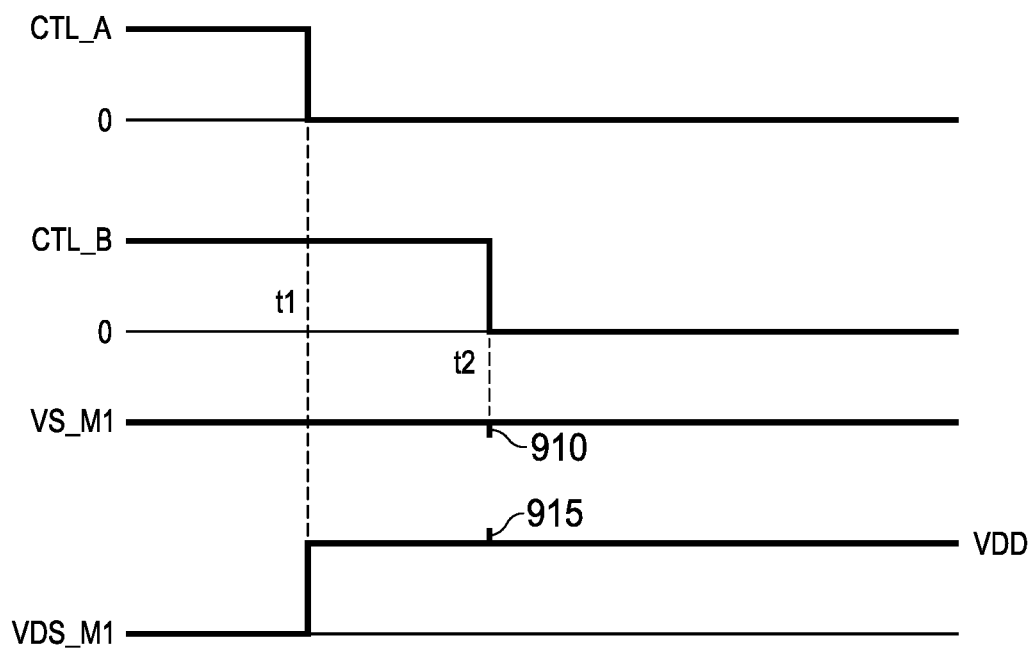
FIG. 9 illustrates waveforms pertaining to the circuit of FIG. 8.

FIG. 9 shows the waveforms pertaining to the operation of the NAND gate 400 of FIG. 8. The waveforms for CTL A, CTL_B, VS_M1, and VDS_M1 are largely the same as in FIG. 2 and described above. A small drop in VS_M1 may be present as identified at 810 in the waveforms of FIG. 9. A corresponding small increase in VDS_M1 also may be present as shown at 915.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A circuit, comprising:
   a first transistor comprising a first current terminal, a second current terminal, and a first control terminal, wherein the first control terminal is configured to receive a first control signal;
   a second transistor coupled in series with the first transistor, the second transistor comprising a third current terminal, a fourth current terminal, and a second control terminal, the third current terminal coupled to the second current terminal, and the fourth current terminal coupled to a ground terminal, wherein the second control terminal is configured to receive a second control signal, and wherein the second control signal is not coupled to the first control signal;
   a third transistor comprising a fifth current terminal, a sixth current terminal, and a third control terminal, the fifth current terminal coupled to the third current terminal and to the second current terminal, the sixth current terminal coupled to a supply voltage terminal, and the third control terminal coupled to the second control terminal; and
   a fourth transistor and a fifth transistor coupled to the first current terminal, a fourth control terminal of the fourth transistor coupled to the first control terminal, a fifth control terminal of the fifth transistor coupled to the second control terminal, and the first current terminal is configured to provide an output signal that is a logical NAND of signals provided to the first and second control terminals.

2. The circuit of claim 1, wherein the second transistor is one of an n-type transistor or a p-type transistor, and the third transistor is the other of the n-type transistor or the p-type transistor.

3. The circuit of claim 1, wherein:
   the first transistor is an n-type metal oxide semiconductor field effect transistor (NMOS);
   the second transistor is an NMOS; and
   the third transistor is a p-type metal oxide semiconductor field effect transistor (PMOS).

4. The circuit of claim 1, wherein the third transistor is configured to force a voltage on the second current terminal and the third current terminal to a supply voltage based on the second transistor being off.

5. The circuit of claim 1, wherein the second control terminal is directly connected to the third control terminal.

6. The circuit of claim 1, wherein a seventh current terminal of the fourth transistor is coupled to the supply voltage terminal and an eighth current terminal of the fifth transistor is coupled to the supply voltage terminal.

* * * * *